United States Patent
Arkun et al.

(10) Patent No.: US 8,680,507 B1
(45) Date of Patent: Mar. 25, 2014

(54) A1N INTER-LAYERS IN III-N MATERIAL GROWN ON DBR/SILICON SUBSTRATE

(71) Applicants: Erdem Arkun, San Carlos, CA (US); Michael Lebby, Apache Junction, AZ (US); Andrew Clark, Los Altos, CA (US); Rytis Dargis, Fremont, CA (US)

(72) Inventors: Erdem Arkun, San Carlos, CA (US); Michael Lebby, Apache Junction, AZ (US); Andrew Clark, Los Altos, CA (US); Rytis Dargis, Fremont, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/742,612

(22) Filed: Jan. 16, 2013

(51) Int. Cl.
| | |
|---|---|
| H01L 33/10 | (2010.01) |
| H01L 33/12 | (2010.01) |
| H01L 29/778 | (2006.01) |

(52) U.S. Cl.
USPC ............ 257/13; 257/27; 257/97; 257/98; 257/190; 257/194; 257/200; 438/29; 438/47; 438/172; 438/496

(58) Field of Classification Search
USPC ................ 257/76, E21.267; 438/46, 481
See application file for complete search history.

(56) References Cited

U.S. PATENT DOCUMENTS

| 6,045,626 A * | 4/2000 | Yano et al. ............ 148/33.4 |
| 2010/0038521 A1* | 2/2010 | Clark et al. ............ 250/208.6 |
| 2010/0116315 A1* | 5/2010 | Clark et al. ............ 136/244 |
| 2010/0244100 A1* | 9/2010 | Oishi et al. ............ 257/201 |

* cited by examiner

*Primary Examiner* — Olik Chaudhuri
*Assistant Examiner* — Christine Enad
(74) *Attorney, Agent, or Firm* — Parsons & Goltry; Robert A. Parsons; Michael W. Goltry

(57) ABSTRACT

A DBR/gallium nitride/aluminum nitride base grown on a silicon substrate includes a Distributed Bragg Reflector (DBR) positioned on the silicon substrate. The DBR is substantially crystal lattice matched to the surface of the silicon substrate. A first layer of III-N material is positioned on the surface of the DBR, an inter-layer of aluminum nitride (AlN) is positioned on the surface of the first layer of III-N material and an additional layer of III-N material is positioned on the surface of the inter-layer of aluminum nitride. The inter-layer of aluminum nitride and the additional layer of III-N material are repeated n-times to reduce or engineer strain in a final III-N layer.

13 Claims, 2 Drawing Sheets

| MATERIAL | n @ 450nm |
|---|---|
| Al2O3 | 1.77 |
| AlN | 2.17 |
| Si | 3.95 |
| REO | 1.9 |

| DBR | Δn |
|---|---|
| Al2O3/REO | 0.23 |
| AlN/REO | 0.27 |
| AlN/Si | 1.78 |
| REO/Si | 2.05 |

US 8,680,507 B1

AlN INTER-LAYERS IN III-N MATERIAL GROWN ON DBR/SILICON SUBSTRATE

FIELD OF THE INVENTION

This invention relates in general to the growth of III-N material on a silicon substrate and more specifically to the formation of a DBR on the silicon substrate and III-N material with one or more aluminum nitride inter-layers grown thereon.

BACKGROUND OF THE INVENTION

In the semiconductor industry, it is known that growing a III-N material, such as GaN, on a silicon substrate is difficult due in large part to the large crystal lattice mismatch (−16.9%) and the thermal mismatch (53%) between silicon and GaN. It is also known that LED devices built on silicon substrates suffer from absorption of emitted light by the silicon substrate. Also, during much of the growth process there must ideally be no exposed silicon surface due to detrimental reaction between the silicon and the various MBE process gasses, i.e. $N_2$ plasma, $NH_3$ and metallic Ga. Also in the case where other growth processes are used, such as MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors).

In the prior art, one method of solving the light absorption problem is to fabricate the LED on a silicon substrate and then bond the finished LED on a reflective coating and remove the silicon substrate. Generally, the top layer of the resulting structure is roughened to improve light extraction efficiency. However, this is a long and work intensive process.

It would be highly advantageous, therefore, to remedy the foregoing and other deficiencies inherent in the prior art.

Accordingly, it is an object of the present invention to provide a new and improved DBR/gallium nitride/aluminum nitride base on a silicon substrate.

It is another object of the present invention to provide a new and improved DBR/gallium nitride/aluminum nitride base on a silicon substrate that greatly reduces strain in III-N material grown on the base.

It is another object of the present invention to provide a new and improved DBR/gallium nitride/aluminum nitride base that reduces or eliminates absorption of light emitted by an LED formed thereon.

It is another object of the present invention to provide a new and improved DBR/gallium nitride/aluminum nitride base that reduces or eliminates the problem of possible damage to the silicon substrate with process gasses.

SUMMARY OF THE INVENTION

Briefly, the desired objects and aspects of the instant invention are realized in accordance with a DBR/gallium nitride/aluminum nitride base grown on a silicon substrate. The DBR is substantially crystal lattice matched to the surface of the silicon substrate. A first layer of III-N material is positioned on the surface of the DBR, an inter-layer of aluminum nitride (AlN) is positioned on the surface of the first layer of III-N material and an additional layer of III-N material is positioned on the surface of the inter-layer of aluminum nitride. The inter-layer of aluminum nitride and the additional layer of III-N material are repeated n-times to reduce or engineer strain in a final III-N layer.

The desired objects and aspects of the instant invention are further achieved in accordance with a preferred method of growing a DBR/gallium nitride/aluminum nitride base on a silicon substrate. The method includes growing a Distributed Bragg Reflector (DBR) on the silicon substrate. The DBR is substantially crystal lattice matched to the surface of the silicon substrate. A first layer of III-N material is positioned on the surface of the DBR, an inter-layer of aluminum nitride (AlN) is positioned on the surface of the first layer of III-N material and an additional layer of III-N material is positioned on the surface of the inter-layer of aluminum nitride. The inter-layer of aluminum nitride and the additional layer of III-N material are repeated n-times to reduce or engineer strain in a final III-N layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

It is known in the semiconductor industry that the fabrication of LEDs on silicon substrates is the most efficient because of the expense and wide use and established technology in the use of silicon. However, as stated above, it is also known that LED devices built on silicon substrates suffer from absorption of emitted light by the silicon substrate. LEDs emit light in all directions and any light directed at the silicon substrate is substantially lost since it is absorbed by the silicon substrate. Prior art has placed reflective surfaces on one side of the LED and removed the substrate so that substantially all light is emitted in one direction. This however is a very tedious and work intensive process.

Figures 1, 2:
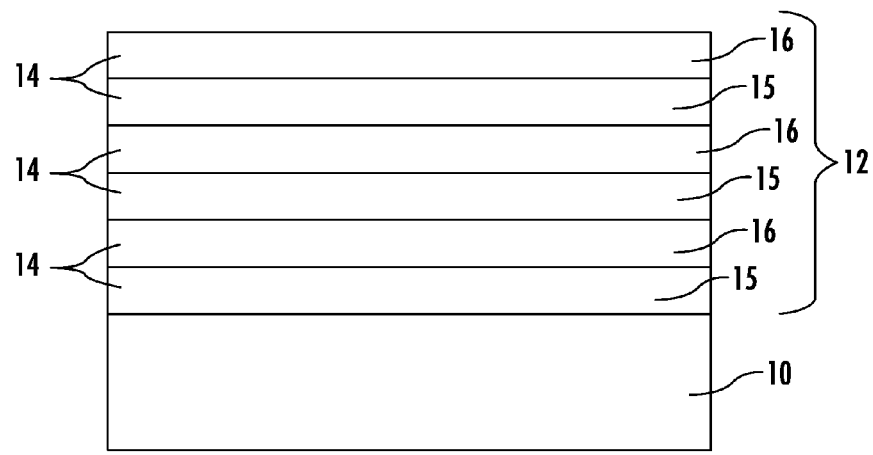
FIG. 1 is a simplified layer diagram of a DBR on a silicon substrate, in accordance with the present invention.
FIG. 2 is a chart illustrating different materials and the indexes of refraction.

Turning to FIG. 1, a simplified layer diagram is illustrated of an example of a Distributed Bragg Reflector (DBR) 12 grown on a silicon substrate 10, in accordance with the present invention. It will be understood that substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. In the present invention a (111) silicon single crystal substrate is preferred because of the simplicity of further epitaxial growth.

As is known in the art, DBRs consist of a plurality of pairs of layers of material, with each pair forming a partial mirror that reflects some of the light incident upon it. In FIG. 1, DBR 12 is illustrated as having three pairs 14 with each pair including layers 15 and 16. Reflection or the mirror effect is produced by choosing the materials of layers 15 and 16 with a substantial difference in the refractive indices. Also, the number of pairs 14 are chosen to provide the most overall reflection for the most efficient, inexpensive or practical device.

Referring additionally to the chart of FIG. 2, the index of refraction for several materials are included with the index of refraction at 450 nm (the general wavelength of light for LEDs formed from III-N materials). Also illustrated in the chart of FIG. 2 is the difference in refractive indices for some pairs of the materials. From the materials included, it was determined that pairs of rare earth oxide and silicon (REO/Si) layers provide the largest refractive index difference (2.05) and therefore provide the best DBR pair.

Generally layers 15 and 16 are grown epitaxially on silicon substrate 10 and on each other as layers of single crystal material. Various rare earth oxides have a crystal lattice spacing that can be substantially matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Thus, REOa-Si2a herein defined as a "substantial crystallographic match". Further, the crystal lattice spacing of the REO layers can be varied by varying the composition of the constituents so that a closer match to GaN can be achieved at the opposite or upper surface.

Because the REO layers and the Si layers are substantially lattice matched, the first and last layers of DBR 12 can be either a REO layer or a Si layer. Also, it should be noted that because the Si layers in DBR 12 are very thin very little impinging light will be absorbed. In the example illustrated, pairs 14 of layers 15 and 16 are repeated three times, which forms a DBR mirror that is highly effective (90% of incident light is reflected) due to the larger refractive index difference between REO and silicon. It will be understood that more or fewer pairs 14 can be incorporated if a greater or lesser effective reflection is desired, e.g. 2-5 pairs. Also, each pair can include the same or a different REO material.

Figure 3:
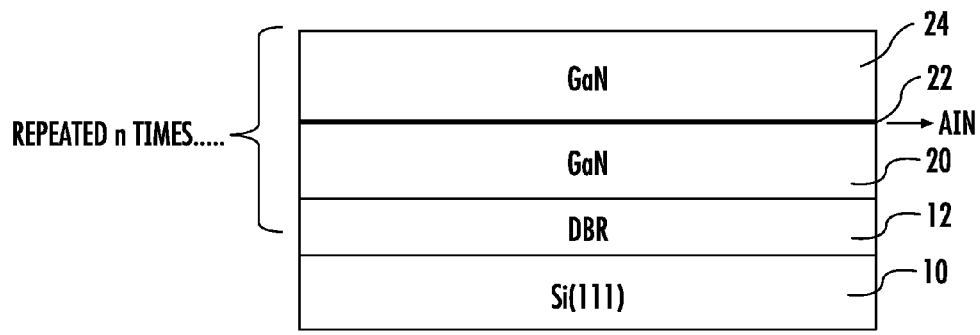
FIG. 3 is a simplified layer diagram illustrating a method of growing DBR/gallium nitride/aluminum nitride on a silicon substrate, in accordance with the present invention.

Turning to FIG. 3, a simplified layer diagram is illustrated representing several steps in a process of growing III-N material and in this preferred example GaN on a silicon substrate 10, in accordance with the present invention. A DBR 12 including rare earth oxide (REO) is epitaxially grown on silicon substrate 10. The crystal lattice spacing of DBR 12 can be varied by varying the composition of the constituents, which allows for strain engineering of the silicon wafers. Generally, the REO material closest to or adjacent silicon substrate 10 will have a crystal spacing closest to the crystal spacing of silicon while REO materials adjacent the opposite side of DBR 12 will have a crystal spacing closer to the crystal spacing of materials grown on the surface. Strain engineering mitigates the stresses formed during growth of III-N materials on these substrates.

It should be noted that rare earth oxide is impervious to MBE process gasses, i.e. $N_2$ plasma, $NH_3$ and metallic Ga, which is the preferred growth process in this invention. Also, in the event that other growth processes are used, such as the MOCVD process, the rare earth oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Thus silicon substrate 10 is protected from damage caused by generally all growth process gasses by rare earth oxide layers in DBR 12.

A first gallium nitride (GaN) layer 20 is epitaxially grown on DBR 12 preferably by an MBE process. Generally, first GaN layer 20 will be in a range of 50 nm to 100 nm thick, although thicker or thinner layers can be grown. Because there will still be some strain in GaN layer 20, i.e. the crystal lattice junction with DBR 12 produces some strain, a thinner layer 20 of GaN is preferred.

A very thin inter-layer of aluminum nitride (AlN) 22 is epitaxially grown on first GaN layer 20 to further reduce the strain. Preferably, AlN inter-layer 22 is in a range of approximately 1 nm to approximately 10 nm thick but for certain applications thicker or thinner films can be grown. Also, AlN inter-layer 22 can be grown using either a low or a high temperature process. A second layer 24 of GaN is epitaxially grown on AlN inter-layer 22. A second inter-layer of AlN (not shown) is grown on second GaN layer 24 and this process is repeated n times or until the strain in the upper or final GaN layer has been reduced to an acceptable level. Basically, the strain formed during the growth of the GaN is controlled by insertion of the thin inter-layers of AlN, each of which allows the following layer of GaN to be under compressive stress due to the pseudomorphic growth at the interface. Repeating the process (i.e. the alternating growth of layers 20, 22 and 24) n times can be used to further reduce or engineer strain in the final GaN or III-N layer. Also, it should be noted that since each additional layer of GaN grown on the next inter-layer of AlN has less strain, each additional layer can be grown thicker if desired.

Figure 4:
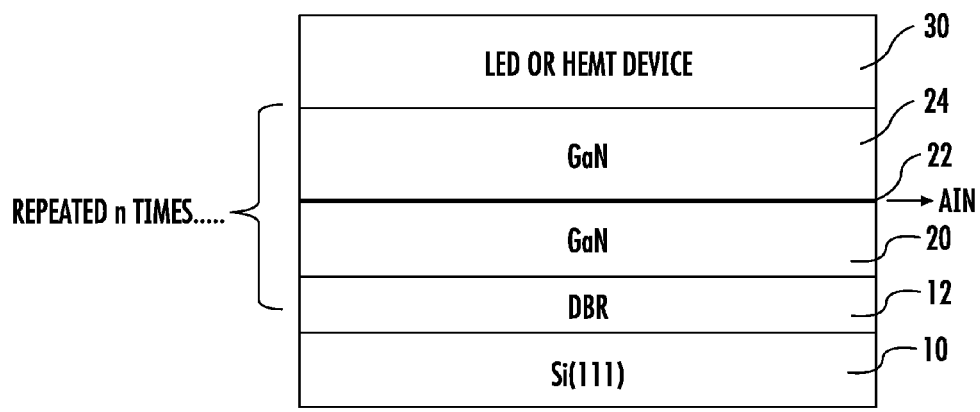
FIG. 4 is a simplified layer diagram of the DBR/gallium nitride/aluminum nitride on the silicon substrate of FIG. 3 with a photonic structure formed thereon.

Turning to FIG. 4, DBR 12, GaN layer 20/AlN inter-layer 22/GaN layer 24 (repeated n times) is illustrated with a III-N LED or HEMT structure 30 formed thereon. Structure 30 is illustrated as a single layer for convenience but it should be understood that III-N LED or HEMT structure 20 includes the growth of one or more typical layers. For example, when structure 30 is an LED the layers may include for example, i-GaN, n-GaN, active layers such as InGaN/GaN, electron blocking layers, p-GaN, and other inter-layers used in the formation and performance of LED (especially photonic LED) devices. When structure 30 is an HEMT the layers may include the growth of one or more typical layers, including for example, i-GaN, AlN, AlGaN, GaN, and other inter-layers used in the formation and performance of HEMT devices.

Thus, new and improved methods for the growth of III-N material and photonic devices on a silicon substrate are disclosed. The new and improved methods for the III-N material include the growth of a substantially crystal lattice matching DBR on the silicon substrate and n repetitions of the growth of thin AlN inter-layers in the III-N material to further reduce or engineer the strain. The DBR reflects light generated in LED or HEMT structures away from the silicon substrate and back in the direction chosen for emission. Also, the DBR eliminates or greatly reduces the problem of possibly damaging the silicon substrate with process gasses. New and improved LED and/or HEMT structures can be substantially lattice matched and thermally matched by the new process on a silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A DBR/gallium nitride/aluminum nitride base grown on a silicon substrate comprising:
   a single crystal silicon substrate;

a Distributed Bragg Reflector (DBR) positioned on the silicon substrate, the DBR being substantially crystal lattice matched to the surface of the silicon substrate, the DBR including multiple layers of single crystal rare earth oxide and alternate layers of single crystal silicon;

a first layer of single crystal GaN positioned on the surface of the DBR, the first layer of GaN including a layer in a range of 50 nm to 100 nm thick; and an inter-layer of single crystal aluminum nitride (AlN) positioned on the surface of the first layer of single crystal GaN, the inter-layer of aluminum nitride having a thickness in a range of 1 nm to 10 nm thick, and an additional layer of single crystal GaN positioned on the surface of the inter-layer of single crystal aluminum nitride, the inter-layer of single crystal aluminum nitride and the additional layer of single crystal GaN repeated n-times to reduce or engineer strain in a final III-N layer; and one of an LED structure and an HEMT structure formed in the final III-N layer, and the Distributed Bragg Reflector (DBR) being positioned to direct emitted light from the substrate.

2. The DBR/gallium nitride/aluminum nitride base grown on the silicon substrate as claimed in claim 1 wherein the HEMT structure includes at least one layer of i-GaN, AlN, AlGaN, or GaN.

3. The DBR/gallium nitride/aluminum nitride base grown on the silicon substrate as claimed in claim 1 wherein at least one of the multiple layers of rare earth oxide included in the DBR include a composition of multiple rare earth oxides one of graded to bridge the multiple rare earth oxides or stepped to have an abrupt change in the rare earth oxides.

4. The DBR/gallium nitride/aluminum nitride base grown on the silicon substrate as claimed in claim 3 wherein the composition including multiple rare earth oxides includes a first rare earth oxide adjacent the silicon substrate having a crystal lattice spacing substantially matching a double lattice spacing of silicon and a second rare earth oxide adjacent the first layer of single crystal GaN having a crystal lattice spacing substantially matching a crystal lattice spacing of the first layer of single crystal GaN.

5. The DBR/gallium nitride/aluminum nitride base grown on the silicon substrate as claimed in claim 1 wherein the one of an LED structure and an HEMT structure includes an LED, and the Distributed Bragg Reflector (DBR) is grown and positioned to reflect light emitted by the LED from the substrate toward the LED.

6. The DBR/gallium nitride/aluminum nitride base grown on the silicon substrate as claimed in claim 1 wherein the LED structure includes at least one layer of i-GaN, n-GaN, an active layer, an electron blocking layer, or p-GaN.

7. A method of growing a DBR/gallium nitride/aluminum nitride base on a silicon substrate comprising the steps of:

providing a single crystal silicon substrate;

epitaxially depositing a Distributed Bragg Reflector (DBR) on the silicon substrate, the DBR including multiple layers of single crystal rare earth oxide and alternate layers of single crystal silicon, and the DBR being substantially crystal lattice matched to the surface of the silicon substrate;

epitaxially depositing a first layer of single crystal GaN on the surface of the DBR, including epitaxially depositing the first layer of GaN in a range of 50 nm to 100 nm thick;

epitaxially depositing an inter-layer of single crystal aluminum nitride (AlN) on the first layer of single crystal GaN, including epitaxially depositing the inter-layer of single crystal aluminum nitride in a range of 1 nm to 10 nm thick;

epitaxially depositing an additional layer of single crystal GaN on the surface of the layer of single crystal aluminum nitride; and repeating the steps of epitaxially depositing the inter-layer of single crystal aluminum nitride and the additional layer of single crystal GaN n-times to reduce or engineer strain in a final III-N layer.

8. The method as claimed in claim 7 wherein the step of growing multiple layers of rare earth oxide includes growing or depositing at least one composition layer including multiple rare earth oxides one of graded to bridge the multiple rare earth oxides or stepped to have an abrupt change in the rare earth oxides.

9. The method as claimed in claim 8 wherein the step of growing or depositing the composition layer includes growing or depositing a first rare earth oxide adjacent the silicon substrate having a crystal lattice spacing substantially matching a double lattice spacing of silicon and a second rare earth oxide adjacent the first layer of single crystal GaN and having a crystal lattice spacing substantially matching a crystal lattice spacing of the first layer of single crystal GaN.

10. A method as claimed in claim 7 wherein the step of epitaxially depositing the final layer of III-N material includes growing one of an LED structure or an HEMT structure on the final layer of III-N material.

11. A method as claimed in claim 10 wherein the step of growing the LED structure on the final layer of III-N material includes growing at least one layer including one of i-GaN, n-GaN, active layers, electron blocking layers, or p-GaN.

12. A method as claimed in claim 10 wherein the step of growing the HEMT structure on the final layer of III-N material includes growing at least one layer including one of, i-GaN, AlN, AlGaN, or GaN.

13. The method as claimed in claim 10 wherein the one of an LED structure and an HEMT structure includes an LED, and the Distributed Bragg Reflector (DBR) is grown and positioned to reflect light emitted by the LED from the substrate toward the LED.

* * * * *